(12) United States Patent
Abe et al.

(10) Patent No.: US 8,053,983 B2
(45) Date of Patent: Nov. 8, 2011

(54) ORGANIC EL DISPLAY AND MANUFACTURING METHOD THEREOF

(75) Inventors: Shinichi Abe, Higashiomi (JP); Motohiko Asano, Yasu (JP); Hiromitsu Ogawa, Yasu (JP)

(73) Assignee: Kyocera Corporation, Kyoto (JP)

( * ) Notice: Subject to any disclaimer, the term of this patent is extended or adjusted under 35 U.S.C. 154(b) by 675 days.

(21) Appl. No.: 11/976,612

(22) Filed: Oct. 25, 2007

(65) Prior Publication Data

US 2008/0129194 A1 Jun. 5, 2008

(30) Foreign Application Priority Data

Oct. 26, 2006 (JP) ................ 2006-291550

(51) Int. Cl.
*H01J 1/62* (2006.01)
*H01J 63/04* (2006.01)
(52) U.S. Cl. .............. 313/512; 313/504; 313/506
(58) Field of Classification Search .......... 313/504–506, 313/512
See application file for complete search history.

(56) References Cited

U.S. PATENT DOCUMENTS

| 6,198,217 | B1 * | 3/2001 | Suzuki et al. ............... 313/504 |
| 6,429,584 | B2 * | 8/2002 | Kubota ............... 313/504 |
| 7,170,087 | B2 | 1/2007 | Kidokoro et al. |
| 2001/0054867 | A1 * | 12/2001 | Kubota ............... 313/504 |
| 2003/0164674 | A1 * | 9/2003 | Imamura ............... 313/493 |
| 2003/0168974 | A1 * | 9/2003 | Matsuki et al. ............... 313/506 |
| 2004/0160175 | A1 * | 8/2004 | Yi ............... 313/506 |
| 2004/0247938 | A1 * | 12/2004 | Yamaguchi et al. ........ 428/690 |
| 2005/0046336 | A1 * | 3/2005 | Utsumi et al. ............... 313/501 |
| 2005/0218803 | A1 | 10/2005 | Takeuchi et al. |
| 2006/0158108 | A1 * | 7/2006 | Hayashi ............... 313/506 |

FOREIGN PATENT DOCUMENTS

| JP | 2001-284041 A | 10/2001 |
| JP | 2005-56587 A | 3/2005 |
| JP | 2005-265659 A | 10/2005 |
| JP | 2006-173092 A | 6/2006 |

OTHER PUBLICATIONS

Japanese Office Action issued on Mar. 22, 2011 in Japanese Patent Application No. 2006-291550 with English translation.

* cited by examiner

*Primary Examiner* — Nimeshkumar D. Patel
*Assistant Examiner* — Thomas A Hollweg
(74) *Attorney, Agent, or Firm* — Birch, Stewart, Kolasch & Birch, LLP (57) ABSTRACT

An organic EL display comprises an element substrate, an organic EL element formed on the element substrate, comprising an organic layer including a light emitting layer and a pair of electrode layers disposed on both sides of the organic layer. The organic layer comprises a first organic material. The organic EL display further comprises a capping layer comprising a second organic material having a glass transition point lower than one of the first organic material and a protective layer on the capping layer.

8 Claims, 8 Drawing Sheets

ORGANIC EL DISPLAY AND MANUFACTURING METHOD THEREOF

CROSS-REFERENCE TO RELATED APPLICATIONS

The present application claims priority of Japanese Patent Application No. 2006-291550, filed on Oct. 26, 2006." The contents of this application are incorporated herein by reference in their entirety.

FIELD OF THE INVENTION

1. Technical Field

The invention relates to an organic EL (electroluminescent) display and a manufacturing method thereof.

2. Description of the Related Art

Generally, an organic EL display has a structure including an organic EL element capable of emitting light disposed on an element substrate, and a protective layer for sealing the organic EL element disposed on the organic EL element. A structure has also been proposed which further includes a capping layer disposed between the organic EL element and the protective layer so that light emitted from the organic EL element is efficiently extracted to the outside (refer to Japanese Unexamined Patent Application Publication No. 2006-173092).

A manufacturing method of such an organic EL display will be briefly described below. For example, first, an element substrate is prepared. An organic EL element and a capping layer are deposited by vapor deposition on the element substrate, and then a protective layer is formed by CVD on the capping layer.

However, in the process of manufacturing the organic EL display, foreign matter, such as particles, may be present between the organic EL element and the capping layer. The protective layer does not easily adhere around such foreign matter, and there may be a case where pinholes are formed in the protective layer. In such a case, moisture and oxygen in air infiltrate into the organic EL element through the pinholes of the protective layer, thus degrading the organic EL element, resulting in a decrease in the yield.

SUMMARY OF THE INVENTION

According to one aspect of the invention, a manufacturing method of an organic EL display comprising preparing an organic EL element comprising an organic layer including a light emitting layer, and a pair of electrode layers disposed on both upper and lower sides of the organic layer. The organic layer comprises first organic material. The manufacturing method also comprising depositing an organic material layer comprising second organic material having a glass transition point lower than one of the first organic material, on the organic EL element.

According to another aspect of the invention, a first organic EL display comprises an organic EL element comprising an organic layer including a light emitting layer, and a pair of electrode layers formed on both upper and lower sides of the organic layer, the organic layer comprising a first organic material. The first organic EL display also comprises a capping layer formed on the organic EL element. The capping layer comprises a second organic material having a glass transition point lower than that of the first organic material. The first organic EL display further comprises a protective layer formed on the capping layer. The capping layer covers at least a lower part of a foreign matter between the organic EL element and the protective layer while an upper part of the foreign matter is exposed from the capping layer.

According to another aspect of the invention, a second organic EL display comprises an organic EL element comprising an organic layer including a light emitting layer, and a pair of electrode layers disposed on both upper and lower sides of the organic layer, the organic layer comprising first organic material. The second organic EL display also comprises a capping layer formed on the organic EL element, comprising second organic material having a glass transition point lower than that of the first organic material. The second organic EL display further comprises a protective layer formed on the capping layer and a partition wall disposed around the organic EL element. The capping layer covers at least a lower part of the partition wall with the upper part of the partition wall exposed from the capping layer.

According to the invention, since at least a lower part of a foreign matter or a partition wall can be satisfactorily covered with the capping layer, the protective layer can be satisfactorily deposited. Consequently, the sealing properties of the organic EL element can be improved.

DESCRIPTION OF THE PREFERRED EMBODIMENT

Embodiments of the organic EL display according to the invention will now be described in detail with reference to the drawings.

First Embodiment

Organic EL Display

Figure 1:
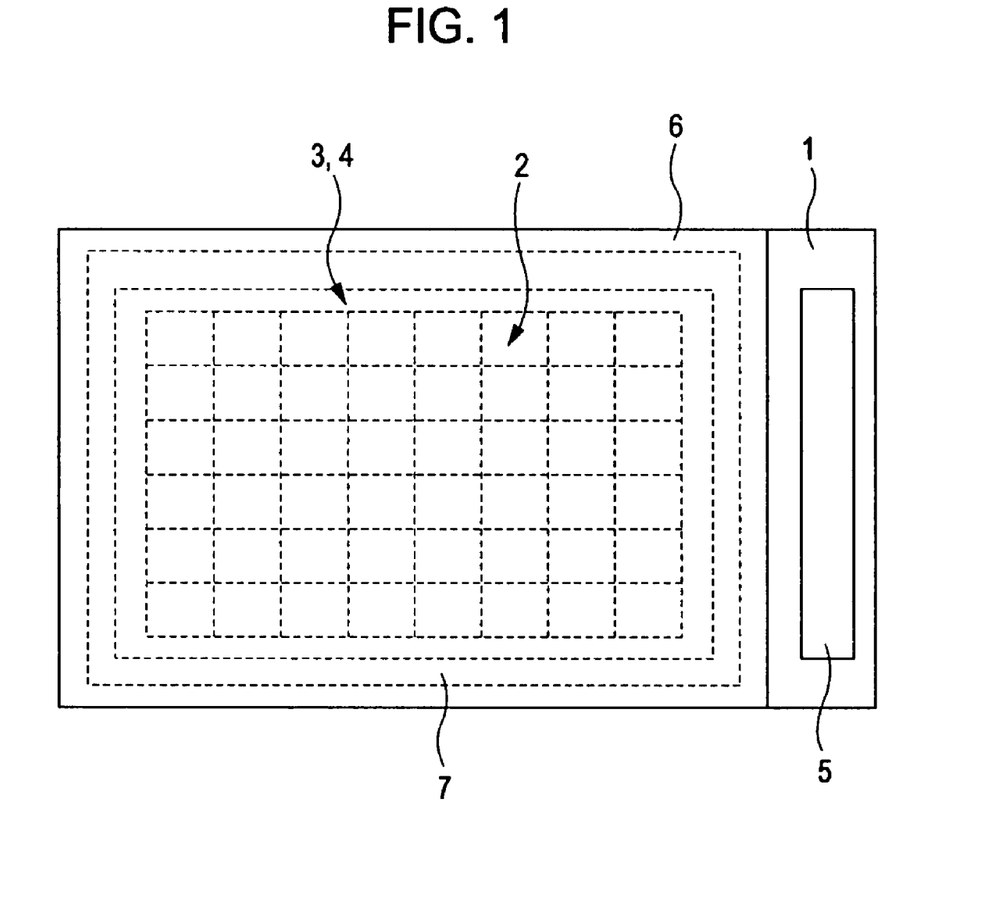
FIG. 1 is a perspective plan view of an organic EL display according to a first embodiment of the invention.

An organic EL display according to a first embodiment is used in an electric household appliance, such as a television, or an electronic apparatus, such as a mobile phone or a computer device, and includes a planar element substrate 1 and organic EL elements 2 disposed on the element substrate 1, as illustrated in FIG. 1. A capping layer 3 and a protective layer 4 are disposed on the organic EL elements 2.

The element substrate 1 is composed of glass or plastic. A plurality of organic EL elements 2 are arranged in a matrix on a display region located in the center of the element substrate 1. A driver IC 5 configured to control light emission of the organic EL elements 2 is mounted on a non-display region located at an end of the element substrate 1.

A cover substrate 6 is disposed on the element substrate 1 so as to be opposed to the element substrate 1. The cover substrate 6 is a transparent substrate and can be composed of, for example, glass or plastic. Furthermore, a sealing material 7 is disposed along the periphery of the display region of the element substrate 1. The plurality of organic EL elements 2 are sealed by the element substrate 1, the cover substrate 6, and the sealing material 7. As the sealing material 7, for example, a photo-curable or thermosetting acrylic resin, epoxy resin, urethane resin, or silicone resin can be used.

Figure 2A:
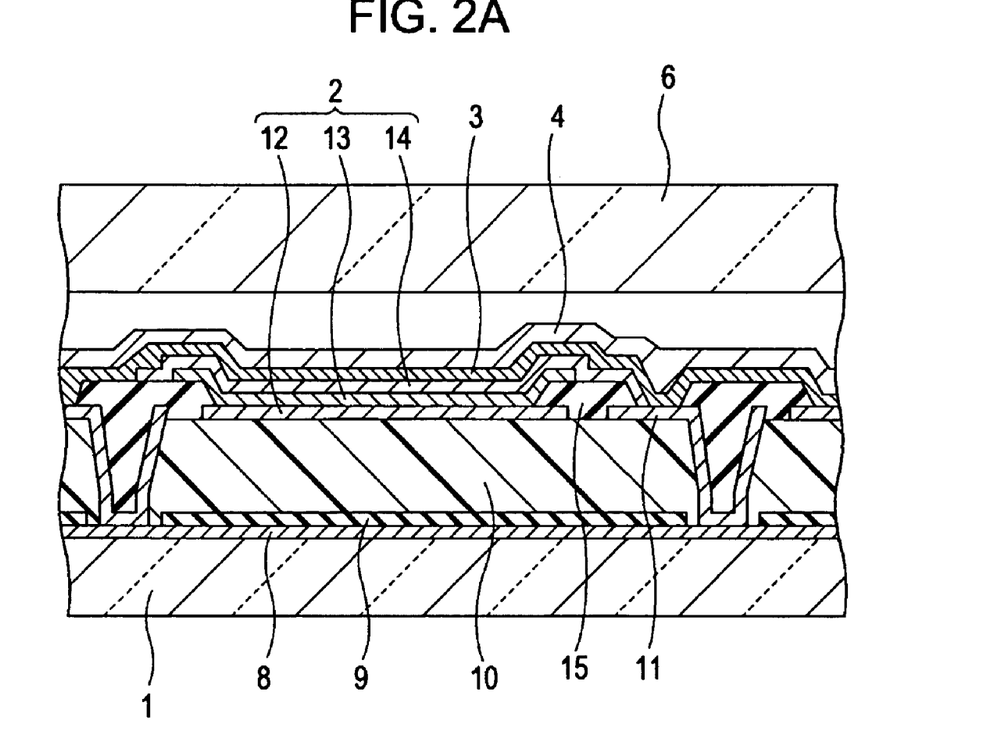
FIG. 2A is a cross-sectional view of a display area of the organic EL display according to the first embodiment.

The individual layers disposed between the element substrate 1 and the cover substrate 6 will now be described with reference to FIGS. 2A, 2B, and 3. A circuit layer 8 provided with TFTs and electric circuit is disposed on the element substrate 1. An insulating layer 9 composed of SiNx ($0<x \leq 1.2$) or the like is disposed on the circuit layer 8 so that the circuit layer 8 is electrically isolated from outside. A planarizing layer 10 composed of a resin is disposed on the insulating layer 9, the planarizing layer 10 reducing irregularities on the circuit layer 8 and the insulating layer 9. As the planarizing layer 10, an organic material having an insulating property, such as a novolac resin, an acrylic resin, an epoxy resin, or a silicone resin, can be used. The planarizing layer 10 is formed in a tapered shape.

Furthermore, through-holes that pass through the planarizing layer 10 and the insulating layer 9 are formed. A contact layer 11 composed of a metal material, such as copper or aluminum, is disposed on the interior surface of each of the through-holes and so as to extend from the interior surface toward the upper surface of the planarizing layer 10. Such a contact layer 11 is electrically connected to the circuit layer 8.

The organic EL elements 2 are disposed on the planarizing layer 10, and each of the organic EL elements 2 includes a lower electrode layer 12, an organic layer 13, and an upper electrode layer 14.

The lower electrode layer 12 is disposed on the upper surface of the planarizing layer 10 and spaced from the contact layer 11. The lower electrode layer 12 is composed of a metal, such as aluminum, silver, copper, gold, or rhodium, an alloy of these metals, or the like. An interlayer insulation film 15 is interposed between the lower electrode layer 12 and the contact layer 11. A part of the interlayer insulation film 15 is interposed between the upper electrode layer 14 and the lower electrode layer 12, thus preventing short-circuiting therebetween.

The organic layer 13 is disposed on the lower electrode layer 12. The organic layer 13 includes, for example, a hole injection layer for injecting holes, a hole transporting layer for transporting holes, a luminescent layer that emits EL light, an electron transporting layer for transporting electrons, and an electron injection layer for injecting electrons stacked in that order from the element substrate 1 side. Note that the structure of the organic layer 13 is not limited to the five-layered structure described above. As long as the luminescent layer is included, any of various layer structures, such as one-layered to four-layered structures, may be employed for the organic layer 13.

Materials for the individual layers constituting the organic layer 13 will be described below. The hole injection layer is composed of, for example, NiOx ($0<x \leq 1.2$), CuPc, TiOx ($0<x \leq 1.2$), CFx ($0<x \leq 1.2$), or the like. The hole transporting layer is composed of, for example, α-NPD, TPD, or the like. The luminescent layer is composed of, for example, CBP, Alq$_3$, SDPVBi, or the like, to which an additive, such as DCJTB, coumarin, quinacridone, styrylamine, or perylene, may be added. The electron transporting layer is composed of, for example, Alq$_3$, oxadiazole, silole, benzothiazole, or the like. The electron injection layer is composed of, for example, LiF, MgF$_2$, CaF$_2$, CsF, BaF$_2$, or the like. Note that the refractive index of the organic layer 13 is in a range of 1.2 to 2.7.

When a voltage is applied between the lower electrode layer 12 and the upper electrode layer 14, a current flows through the organic layer 13, thereby causing electroluminescence.

The upper electrode layer 14 is disposed on the organic layer 13 and is composed of a light-transmitting electrically conductive material. The upper electrode layer 14 extends from on the organic layer 13 through the interlayer insulation film 15 onto the contact layer 11 and is electrically connected to the contact layer 11. The upper electrode layer 14 is composed of, for example, a transparent electrically conductive material, such as ITO or IZO, an alkali metal, such as Li, an alkaline-earth metal, such as Mg, Ca, Sr, or Ba, or an alloy of these metals. When a metal, such as an alkali metal or an alkaline-earth metal, is used for the upper electrode layer 14, by decreasing the thickness of the upper electrode layer 14, light can be transmitted through the upper electrode layer 14.

The capping layer 3 is allowed to have a function of efficiently extracting light emitted by the organic layer 13 to the outside by appropriately setting the thickness and the refractive index thereof so that the wavelength of the forward wave traveling from the capping layer 3 toward the protective layer 4 and the wavelength of the reflected wave reflected by the upper electrode layer 14 and traveling toward the protective layer 4 are combined to efficiently resonate light. In view of efficient resonance of light, the difference in the refractive index between the protective layer 4 and the capping layer 3 is preferably 0.7 or less, and more preferably 0.3 or less.

The capping layer 3 is formed so as to cover the organic EL element 2 disposed on the element substrate 1 side. Specifically, in the display region, the capping layer 3 is formed so as to cover the upper electrode layer 14, and in the non-display region, the capping layer 3 is formed from on the planarizing layer 10 onto the insulating layer 9 through the side surface of the planarizing layer 10. The end of the capping layer 3 is located between the sealing material 7 and the planarizing layer 10. The thickness of the capping layer 3 is in a range of 50 to 200 nm.

The capping layer 3 is composed of an organic material, such as α-NPD, TPD, or m-MTDATA, having a glass transition point lower than that of the organic material constituting the organic layer 13 of the organic EL element 2. The capping layer 3 includes a crystalline portion where molecules are densely packed and an amorphous portion where molecules are sparsely packed. Here, the glass transition point is defined as the temperature at which the amorphous portion starts to fluidize when the capping layer 3 is heated.

Specifically, when α-NPD with a glass transition point of 95° C. is used for a part of the layers constituting the organic EL element 2, the organic material used for the capping layer 3 is composed of m-MTDATA with a glass transition point of 75° C. or TPD with a glass transition point of 60° C. Note that the melting point of α-NPD is 280° C. to 285° C., which is higher than the glass transition point. When any of the materials described above is used for the capping layer 3, the refractive index of the capping layer 3 is in a range of 1.6 to 2.7.

The capping layer 3 is composed of a low-molecular-weight organic material that can be deposited by vapor deposition, unlike polymers, and thus the production process can be simplified.

Figure 2B:
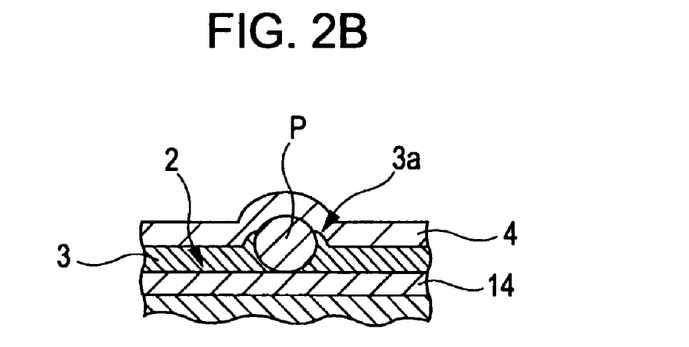
FIG. 2B is an enlarged partial cross-sectional view of the organic EL display according to the first embodiment.
Figure 3:
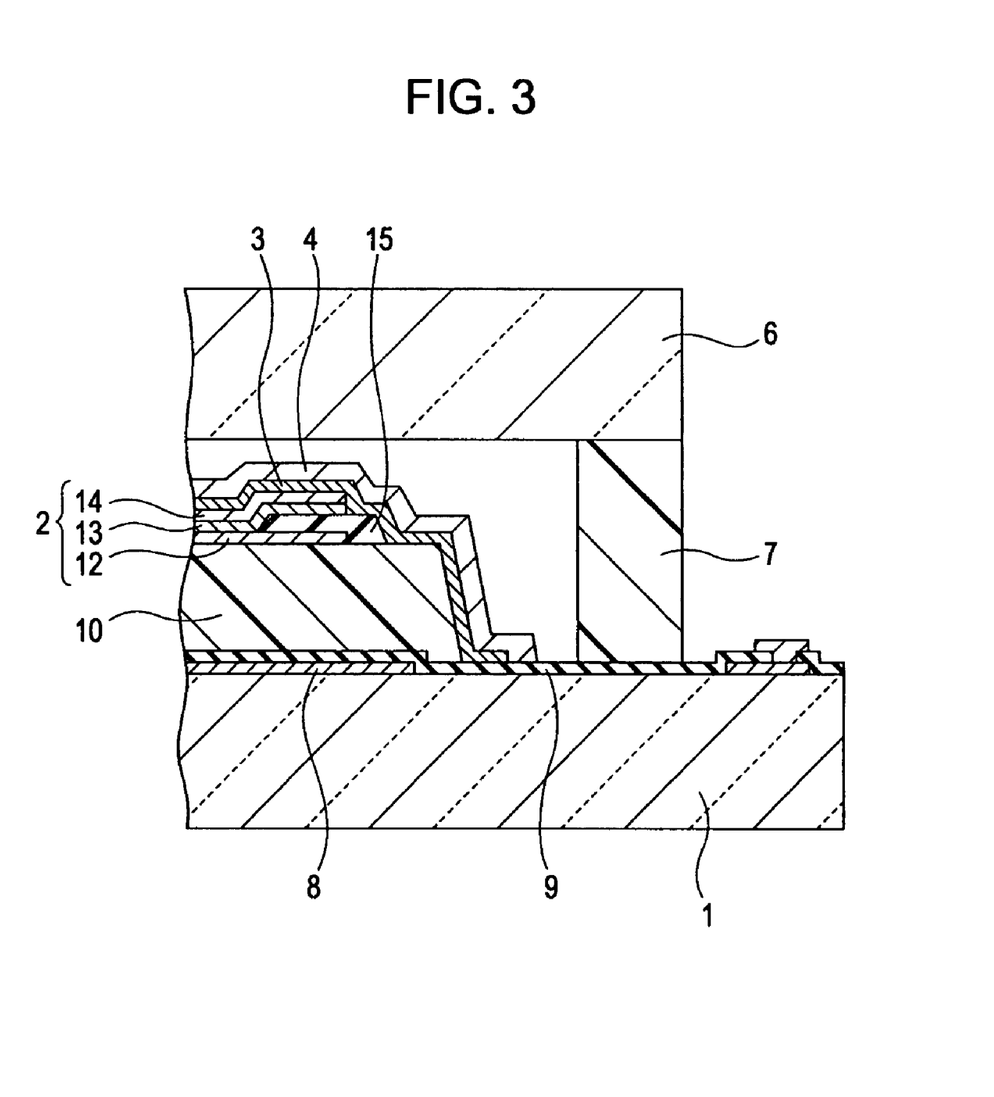
FIG. 3 is a cross-sectional view of a non-display area of the organic EL display according to the first embodiment.

As illustrated in FIG. 2B, foreign matter P, such as a particle, often adheres onto a part of the organic EL element 2. In this embodiment, the capping layer 3 is in close contact with the lower side surface of the foreign matter P so that the capping layer 3 is not easily separated from the foreign matter P by a gap. As illustrated in FIG. 2B, the thickness of the capping layer 3 is smaller than the height of the foreign matter P. In this case, although the upper part of the foreign matter P is not covered with the capping layer 3, the capping layer 3 can keep close contact with the foreign matter without having a gap therebetween. A portion 3a of the capping layer 3 covering the side surface of the foreign matter P covers the periphery of the foreign matter P so as to swell from the element substrate 1 side toward the cover substrate 6 side, and thus the difference in level between the planer portion of the capping layer 3 and the top of the foreign matter P is decreased.

The protective layer 4 extends from on the capping layer 3 onto the element substrate 1 so as to cover the capping layer 3. The protective layer 4 covers the organic EL elements 2 and the capping layer 3 and can protect them from moisture and external air. The protective layer 4 has a light-transmitting property and is composed of an inorganic material, such as SiNx (0<x≦1.2), SiOx (0<x≦1.2), or SiON. The thickness of the protective layer 4 is in a range of 500 nm to 5 μm. When the protective layer 4 is composed of SiNx (0<x≦1.2), SiOx (0<x≦1.2), or the like, the refractive index thereof is 1.5 to 2.0.

When the foreign matter P adheres onto the organic EL element 2, the protective layer 4 is formed so as to cover the foreign matter P. The protective layer 4 is continuously formed on the upper surface of the capping layer, the portion 3a and a part of the foreign matter P.

In such a manner, by covering the entire surface of the capping layer 3 comprising an organic material through which moisture and oxygen easily pass compared with the inorganic material, it is possible to reduce moisture and oxygen infiltrating into the capping layer 3. Furthermore, since the capping layer 3 is in close contact with the foreign matter P, it is possible to reduce peeling of the protective layer 4 due to the presence of a gap.

<Manufacturing Method of Organic EL Display>

A manufacturing method of the organic EL display according to the first embodiment described above will now be described. First, a circuit layer 8 can be formed in a predetermined pattern on an element substrate 1 using a thin-film forming technique, such as known CVD, sputtering, or spin-coating, and a thin-film processing technique, such as etching or photolithography. Then, an insulating layer 9, a planarizing layer 10, a contact layer 11, a lower electrode layer 12, and an interlayer insulation film 15 are formed in that order on the circuit layer 8 using the thin-film forming technique and the thin-film processing technique.

Subsequently, an organic layer 13 is formed on the lower electrode layer 12 and the interlayer insulation film 15 by vapor deposition using a vapor deposition mask. Specifically, in a vacuum chamber provided with a vapor deposition source capable of heating and vaporizing a vapor deposition material on the lower part thereof, the element substrates on which the individual layers described above are formed and a vapor deposition mask having many openings are prepared. Then, the element substrate 1 is arranged on the upper part in the vacuum chamber with the side provided with the individual layers being directed downward.

The vapor deposition mask is disposed between the element substrate 1 and the vapor deposition source, and at the same time, the vapor deposition mask is aligned with the element substrate 1 so as to expose portions of the element substrate 1 on which the organic layer 13 is formed. A high vacuum is produced in the vacuum chamber, and an organic material is heated and vaporized from the vapor deposition source to form the organic layer 13 on the element substrate 1 through the openings of the vapor deposition mask.

Subsequently, with the vacuum being maintained, an upper electrode layer 14 is deposited by vapor deposition to form each of organic EL elements 2. Then, with the vacuum being maintained, an organic material constituting a capping layer 3 is vaporized by vapor deposition to deposit an organic material layer 3' on the upper electrode layer 14.

Subsequently, by applying heat to the organic EL element 2 and the organic material layer 3', the organic material layer 3' is fluidized. Since heat is not easily transmitted in a vacuum, the temperature of the vapor deposition source located on the lower part of the vacuum chamber is greatly different from the temperature of the element substrate 1 located on the upper part. Consequently, heat is directly applied to the element substrate 1 by a heater or the like.

The temperature applied to the organic EL element 2 and the organic material layer 3' is higher than the glass transition point of the organic material layer 3' and lower than the glass transition point of the organic layer 13 constituting the organic EL element 2. Preferably, the temperature applied to the organic EL element 2 and the organic material layer 31 is lower than the glass transition point of the organic layer 13 by 10° C. or more. When the temperature is increased to the glass transition of the organic material constituting the organic material layer 3', the amorphous portion of the organic material layer 3' starts to be fluidized, and when the organic EL element 2 and the organic material layer 3' are heated up to the melting point of the organic material constituting the organic material layer 3', a non-amorphous portion of the organic material layer 31 starts to be fluidized. Consequently, the heating temperature for the organic EL element 2 and the organic material layer 3' is lower than the glass transition point of the organic layer 13 constituting the organic EL element 2. Most of the portion fluidized in the organic material layer 3' may correspond to the amorphous portion of the organic material layer 3'.

As a result, the amorphous portion of the organic material layer 3' can be fluidized without fluidizing the organic layer 13 constituting the organic EL element 2. Then, the temperature of the organic material layer 3' is set lower than the glass transition point of the organic material layer 3 to solidify the fluidized organic material layer 3', and thus a capping layer 3 is formed.

The method for forming the capping layer 3 will be described below in detail with reference to FIGS. 4A to 4C.

Figure 4A:
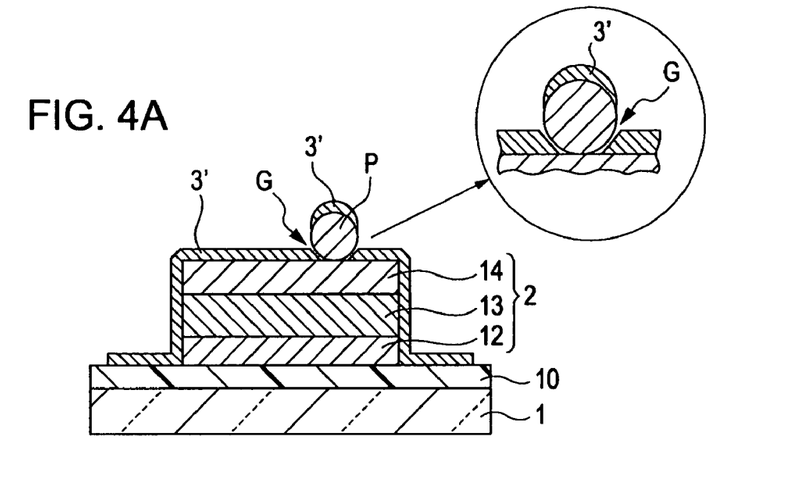
FIGS. 4A, 4B, and 4C illustrate a process of forming an organic material layer of the organic EL display illustrated in FIG. 1 and illustrate, respectively, the organic material layer before fluidization, the organic material layer after fluidization, and the organic material layer after solidification.
Figure 4B:
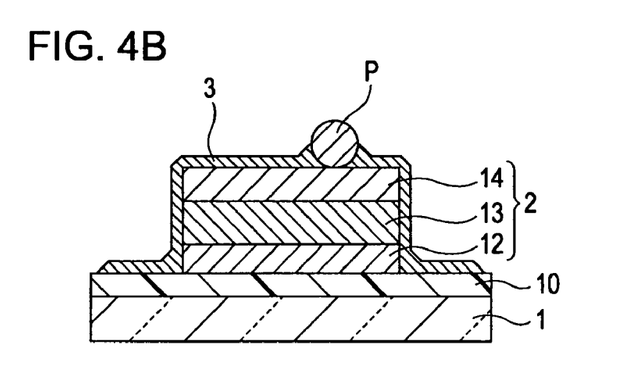
Figure 4C:
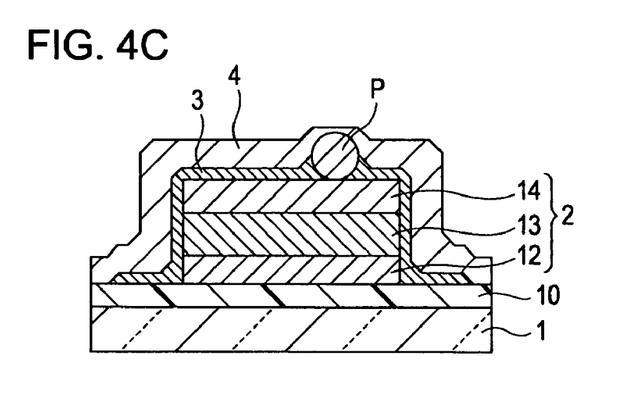

FIGS. 4A to 4C are cross-sectional views schematically illustrating the state of the organic EL element 2 and the capping layer 3.

As illustrated in FIG. 4A, when foreign matter P, such as a particle, adheres on the organic EL element 2 and the organic material layer 3', there may be a case where a part of the organic material layer 3' is formed on the foreign matter P and a gap G is present between the organic EL element 2 and the foreign matter P. As illustrated in FIG. 4B, when the organic material layer 3' is fluidized, the part of the organic material layer 3' on the foreign matter P moves to the element substrate 1 side through the side surface of the foreign matter P. The fluidized organic material layer 3' enters and fills the gap G. Then, the organic material layer 3' is solidified to form the capping layer 3.

Subsequently, the element substrate 1 is transferred to a CVD apparatus, and as illustrated in FIG. 4C, the protective layer 4 is formed by CVD on the solidified capping layer 3. When CVD is employed, a reactive gas constituting the protective layer 4 is easily adsorbed onto a planar surface. However, when a gap G is present, the reactive gas does not easily infiltrate into the gap G, and thus pinholes may be formed in the protective layer 4. On the other hand, according to this embodiment, the gap G can be filled with the capping layer 3, and the protective layer 4 can be continuously formed on the capping layer 3.

Finally, the organic EL elements 2 of the element substrate 1 and one surface of a cover substrate 6 are placed so as to oppose each other, and a sealing material 7 is provided in the periphery of each of the element substrate 1 and the cover substrate 6 to seal the organic EL elements 2. A driver IC 5, etc. is connected to the element substrate 1, and thereby, an organic EL display is completed.

As described above, when there is a gap between the capping layer 3 and the foreign matter P, the gap can be filled by fluidizing the organic material layer 3'. Such a capping layer 3 is formed on the planarizing layer 10 so as to cover the side surface of the planarizing layer 10, as illustrated in FIG. 3. Consequently, when there is a space between the end of the planarizing layer 10 and the insulating layer 9, the space can be filled. As a result, the step coverage of the protective layer 4 formed on the capping layer 3 can be improved. Furthermore, since the planarizing layer 10 is composed of an organic material, moisture and oxygen easily pass through the planarizing layer 10. However, by fluidizing the organic material layer 3', irregularities on the planarizing layer 10 can be reduced, and the protective layer 4 can be continuously formed on the planarizing layer 10 through the capping layer 3. As a result, it is possible to reduce moisture and oxygen passing through the planarizing layer 10 and infiltrating into the organic EL element 2.

In the manufacturing method described above, after the organic material constituting the capping layer 3 is vaporized by vapor deposition, the organic material layer 3' is fluidized. A method may be used in which the upper electrode layer 14 is previously heated when vapor deposition is performed so that the organic material deposited on the upper electrode layer 14 is fluidized with the heat held in the upper electrode layer. In such a case, it is possible to shorten the period of time for manufacturing the organic EL display.

In the manufacturing method described above, after the vapor deposition material for the capping layer 3 is vaporized by vapor deposition, the organic material layer 3' is heated without turning the element substrate 1 upside down. Specifically, the organic material layer 3' keeps facing downward during fluidizing and vaporizing the organic material layer 3'. However, when the viscosity of the organic material constituting the capping layer 3 is relatively low, in order to prevent the fluidized organic material layer 3', which has been fluidized by heating, from dripping from the surface of the upper electrode layer 14 toward the vapor deposition source located below, preferably, after the element substrate 1 is reversed such that the organic material layer 3' is arranged above the element substrate 1, the organic material layer 3' is heated.

Second Embodiment

Figure 5:
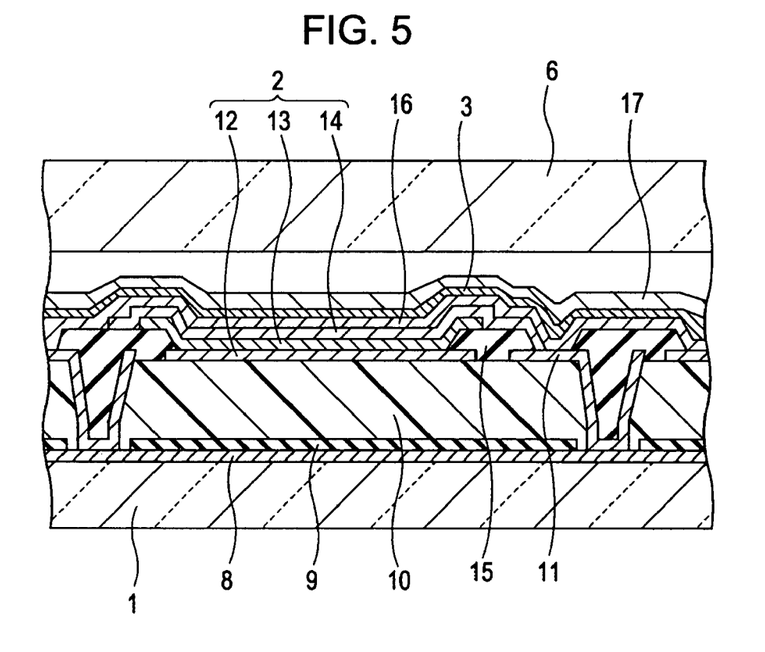
FIG. 5 is a cross-sectional view of a display area of an organic EL display according to a second embodiment of the invention.

An organic EL display according to a second embodiment will be described below with reference to FIG. 5. The parts different from the first embodiment will be mainly described.

In the organic EL display according to the second embodiment, a first protective layer 16, a capping layer 3, and a second protective layer 17 are formed in that order on an upper electrode layer 14. Each of the first protective layer 16 and the second protective layer 17 is composed of, for example, an inorganic material, such as SiNx ($0<x\leq1.2$), SiOx ($0<x\leq1.2$), or SiON, and the thickness thereof is in a range of 500 nm to 5 μm, as in the protective layer 4 described above. Each of the first protective layer 16 and the second protective layer 17 is formed by known CVD. The first protective layer 16 and the second protective layer 17 protect the organic EL element 2 from moisture and external air as in the protective layer 4.

By forming the capping layer 3 on the first protective layer 16, even when the first protective layer 16 has a gap such as a pinhole, the gap can be covered with the capping layer 3. Furthermore, by fluidizing the organic material layer 3' by heating, the organic material layer 3' is allowed to even enter the gap, and the step coverage on the first protective layer 16 can be improved. Consequently, the second protective layer 17 can be continuously formed on the capping layer 3.

Furthermore, by doubly covering the organic EL element 2 with the first protective layer 16 and the second protective layer 17, it is possible to reduce moisture and oxygen infiltrating into the organic EL element 2. By forming the first protective layer 16 using SiON that can easily reduce irregularities on the substrate, the capping layer 3 can be easily formed on the first protective layer 16, and thus the step coverage on the first protective layer 16 can be improved. Furthermore, by forming the second protective layer 17 using SiNx ($0<x\leq1.2$) that can more effectively prevent the infiltration of moisture and oxygen than SiON, it is possible to satisfactorily reduce degradation of the organic EL element.

Third Embodiment

An organic EL display according to a third embodiment will be described below with reference to FIG. 6. The parts different from the first embodiment will be mainly described.

In the organic EL display according to the third embodiment, a partition wall 18 having a reversed-tapered shape in which the bottom is narrower than the top is formed on an interlayer insulation film 15, and an organic material layer 3 is formed on the side surface of the partition wall 18.

When an organic EL element 2 is formed by known vapor deposition, the upper surface of the partition wall 18 functions as an eaves or a mask so that an organic layer 13 and an upper electrode 14 are not continuously formed at the inclined side surface of the partition wall 18. Consequently, the upper electrode layer 14 can be divided into the individual pixels.

After an organic material layer 3' is formed on the partition wall 18 and the organic EL element 2 by vapor deposition, a capping layer 3 is formed by heating at a temperature equal to or higher than the glass transition point of the organic material layer 3' and equal to or lower than the glass transition point of the organic layer 13.

Figure 7:
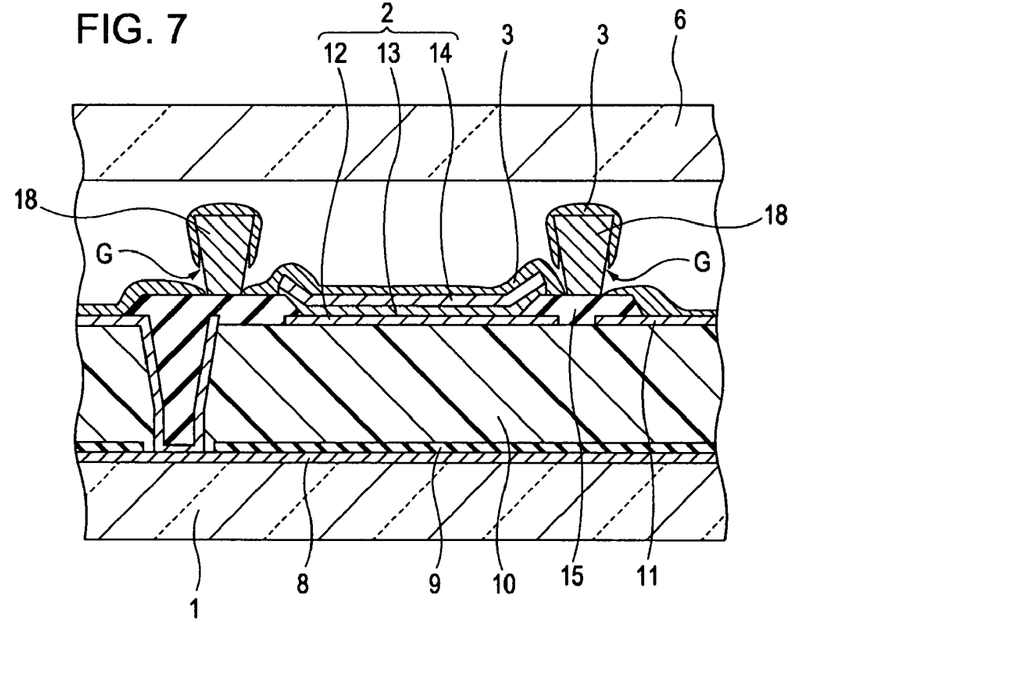
FIG. 7 is a cross-sectional view of the display area of the organic EL display according to the third embodiment and illustrates an organic material layer before fluidization.

As illustrated in FIG. 7, since the partition wall 18 has a reversed-tapered shape, the organic material layer 3' before heating does not adhere to the lower side surface of the partition wall 18, and the organic material layer 3' is formed separately on the organic EL element 2 and on the partition wall 18. At this stage, there may be a case where a gap G is formed between the organic material layer 3' deposited on the partition wall 18 and the lower side surface of the partition wall 18. If a protective layer 4 is formed on the organic material layer 3' with such a gap G being present, the protective layer 4 does not easily adhere to the periphery of the gap G, and there is a possibility that pinholes may be formed in the protective layer 4.

Figure 8:
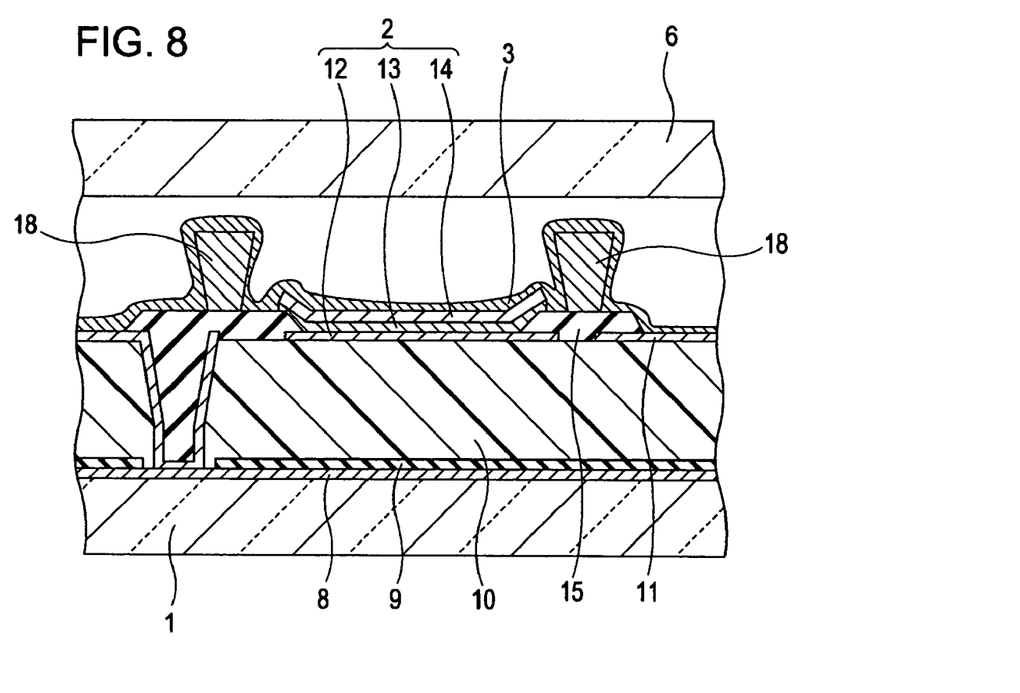
FIG. 8 is a cross-sectional view of the display area of the organic EL display according to the third embodiment and shows an example of the organic material layer after solidification.
Figure 9:
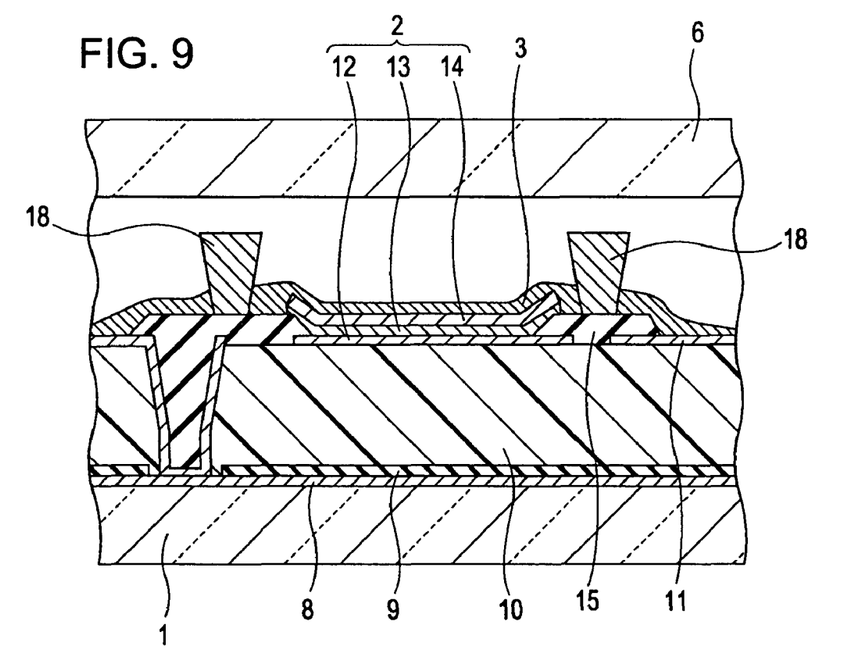
FIG. 9 is a cross-sectional view of the display area of the organic EL display according to the third embodiment and shows another example of the organic material layer after solidification.

Consequently, in this embodiment, as described above, the organic material layer 3' is heated at the temperature described above. Therefore, when the organic material layer 3' is heated, as illustrated in FIG. 8 or 9, the organic material layer 3' on the partition wall 18 is fluidized by heating and fills the gap G. Depending on the relationship between the material for the partition wall 18 and the material for the organic material layer 3', in the case where the organic material layer 3' is not easily fluidized, a state as illustrated in FIG. 8 is obtained, and in the case where the organic material layer 3' is easily fluidized, a state as illustrated in FIG. 9 is obtained.

Figure 6:
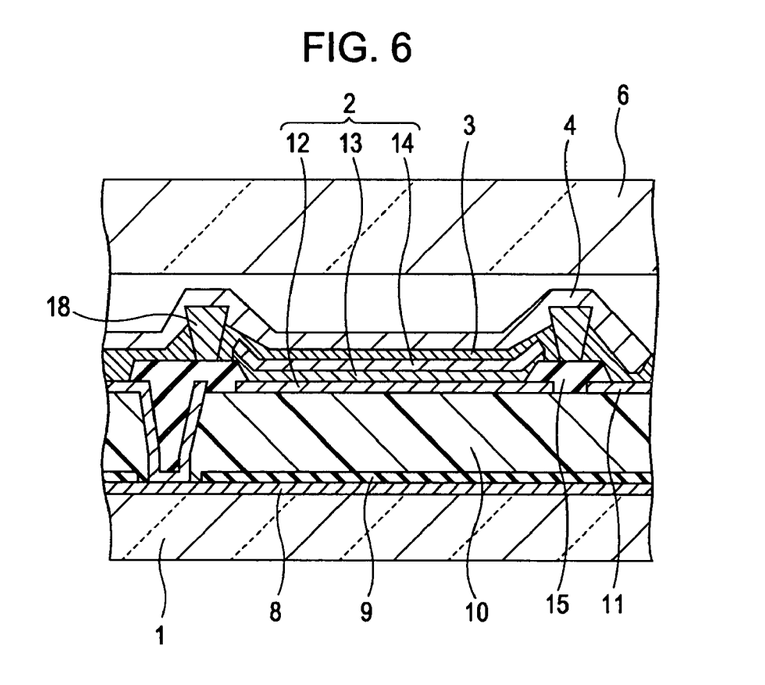
FIG. 6 is a cross-sectional view of a display area of an organic EL display according to a third embodiment of the invention.

As a result, as shown in FIG. 6, it is possible to enhance the quality of the protective layer 4. Furthermore, by covering the side surface of the reversed-tapered partition wall with a part of the capping layer 3, the step coverage of the protective layer 4 formed on the partition wall 18 can be improved, and the protective layer 4 can be formed continuously.

Fourth Embodiment

Figure 10:
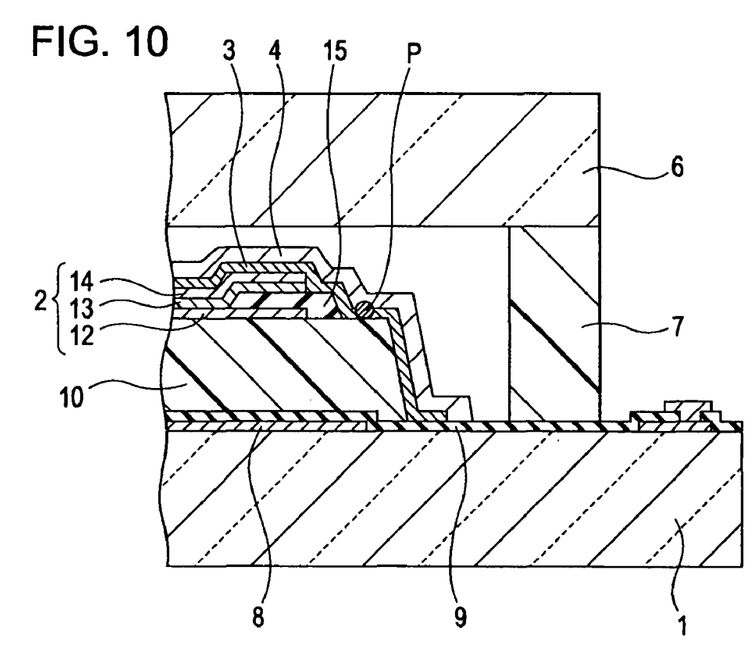
FIG. 10 is an enlarged partial cross-sectional view of an organic EL display according to a fourth embodiment of the invention.
Figure 11:
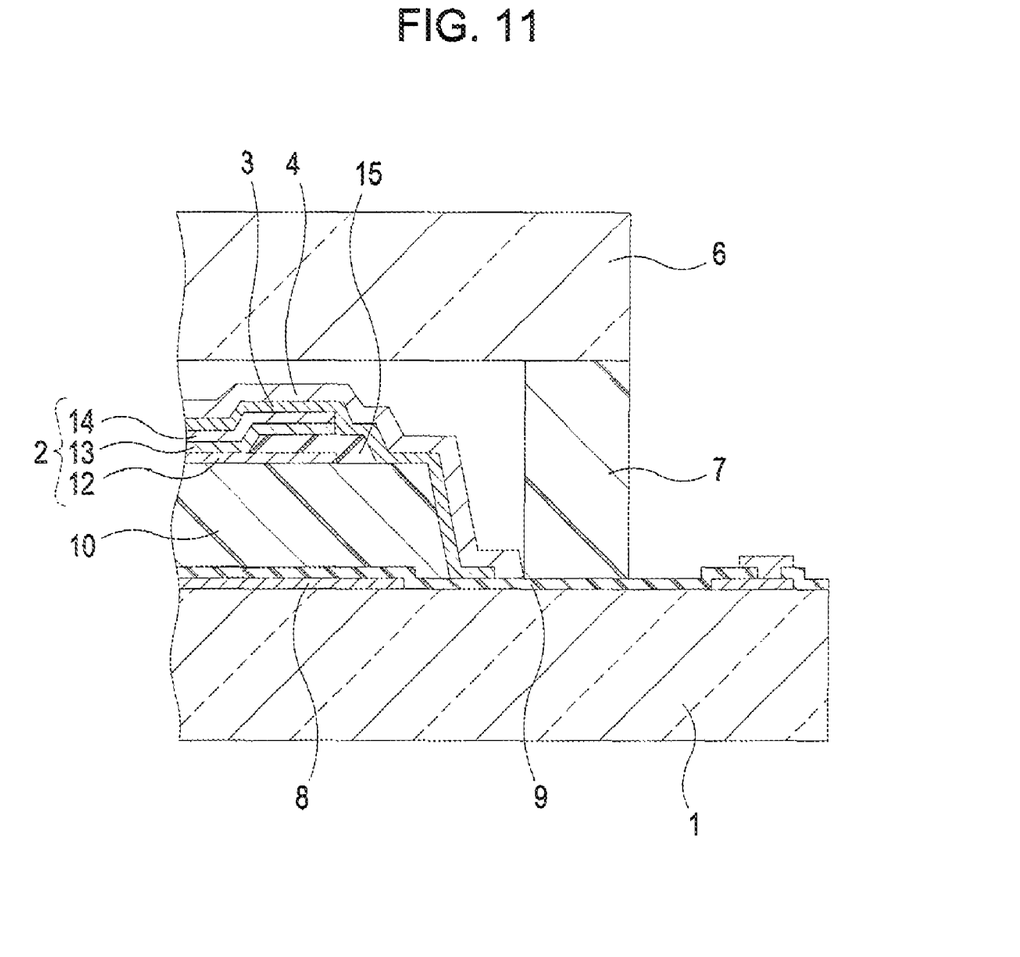
FIG. 11 is a cross-sectional view of a non-display area of the organic EL display according to another first embodiment.

An organic EL display according to a fourth embodiment will be described below with reference to FIG. 10. The parts different from the first embodiment will be mainly described.

Foreign matter P, such as a particle, often adheres onto a planarizing layer 10. In such a case, as in the embodiment described above, a pinhole may be formed due to the foreign matter P in a protective layer 4.

Consequently, as in the embodiment described above, an organic material layer 3' formed on the planarizing layer 10 is fluidized by heating so that a gap between the foreign matter P and the organic material layer 3' is filled, and thus a capping layer 3 is formed. The thickness of the capping layer 3 is smaller than the height of the foreign matter P. Even at such a thickness, it is possible to fill the gap caused by the foreign matter P. In such a case, as illustrated in FIG. 10, a part of the capping layer 3 is in contact with the lower side surface of the foreign matter P with an upper portion of the foreign matter P being exposed.

Since the part of the surface of the lower portion of the foreign matter P is satisfactorily covered with the capping layer 3, it is possible to reduce pinholes which may be formed in the protective layer 3 disposed thereon.

In each of the embodiments described above, the sealing material 7 is disposed along the periphery of the element substrate 1. However, the sealing material 7 may be formed so as to cover the entire display region between the element substrate 1 and the cover substrate 6.

In each of the embodiments described above, a top emission structure has been explained in which light emitted from the organic EL element 2 is extracted from the cover substrate 6 side. A bottom emission structure in which light is extracted from the element substrate 1 side may be possible.

It is to be understood that the invention is not limited to the embodiments described above, and various modifications, improvements, etc. will be possible within the scope of the invention.

What is claimed is:

1. An organic EL display comprising:
an organic EL element comprising an organic layer including a light emitting layer, and a pair of electrode layers on both upper and lower sides of the organic layer, the organic layer comprising a first organic material;
a capping layer on the organic EL element, comprising a second organic material having a glass transition point lower than that of the first organic material;
a protective layer on the capping layer; and
a partition wall around the organic EL element, wherein
the capping layer covers at least a lower part of the partition wall while an upper part of the partition wall is exposed from the capping layer,
the capping layer has an optical thickness to resonate a traveling wave of light traveling from the capping layer toward the protective layer and a reflective wave of light traveling from an upper layer of the electrode layers toward the protective layer, and
the capping layer lies in a region enclosed in the partition wall and is interposed between the protective layer and the organic EL element.

2. An organic EL display according to claim 1, wherein a difference in refractive indexes between the capping layer and the protective layer is within 0.7.

3. An organic EL display according to claim 1, further comprising:
a circuit layer configured to control light emission of the organic EL element; and
a planarizing layer covering the circuit layer;
wherein the organic EL element is formed on the planarizing layer and a part of the protective layer is formed on the planarizing layer; and
wherein the capping layer has an extended portion on the planarizing layer, the extended portion covering at least a lower part of a second foreign matter between the protective layer and the planarizing layer while an upper part of the second foreign matter is exposed from the extended portion.

4. An organic EL display according to claim 3, further comprising:
an element substrate comprising the circuit layer;
a cover substrate disposed on the element substrate to be opposite to the element substrate; and
a sealing material disposed between the element substrate and cover substrate, surrounding the organic EL element;
wherein the capping layer is formed inside a region surrounded by the sealing material.

5. An organic EL display according to claim 3, further comprising:
an element substrate comprising the circuit layer;
a cover substrate disposed on the element substrate to be opposite to the element substrate; and
a sealing material disposed between the element substrate and cover substrate, contacting the protective layer on the organic EL element.

6. An organic EL display according to claim 1, wherein the lower part of the partition wall is the lower side surface thereof.

7. An organic EL display according to claim 3, wherein the lower part of the second foreign matter is the lower side surface thereof.

8. An organic EL display according to claim 1, wherein the capping layer is in a thickness of 50 to 200 nm.

* * * * *

UNITED STATES PATENT AND TRADEMARK OFFICE
CERTIFICATE OF CORRECTION

| | |
|---|---|
| PATENT NO. | : 8,053,983 B2 |
| APPLICATION NO. | : 11/976612 |
| DATED | : November 8, 2011 |
| INVENTOR(S) | : Shinichi Abe et al. |

It is certified that error appears in the above-identified patent and that said Letters Patent is hereby corrected as shown below:

ON THE TITLE PAGE:

Item (73), Assignee, change "Kyocera Corporation, Kyoto (JP)" to --LG Display Co., Ltd., Seoul (KR)--.

Signed and Sealed this
Eighteenth Day of September, 2012

David J. Kappos
*Director of the United States Patent and Trademark Office*